United States Patent
Otsuka et al.

[11] Patent Number: 6,154,393
[45] Date of Patent: Nov. 28, 2000

[54] SEMICONDUCTOR MEMORY DEVICE OF DOUBLE-DATA RATE MODE

[75] Inventors: Nobuaki Otsuka, Kawasaki; Osamu Hirabayashi, Hiratsuka, both of Japan

[73] Assignee: Kabushiki Kaisha Toshiba, Kawasaki, Japan

[21] Appl. No.: 09/268,688

[22] Filed: Mar. 16, 1999

[30] Foreign Application Priority Data

Mar. 17, 1998 [JP] Japan .................................. 10-067314

[51] Int. Cl.$^7$ ..................................................... G11C 7/00
[52] U.S. Cl. ............................... 365/189.02; 365/189.05; 365/233
[58] Field of Search ................. 365/189.02, 189.05, 365/230.02, 238.5, 236, 233

[56] References Cited

U.S. PATENT DOCUMENTS

| | | | |
|---|---|---|---|
| 5,530,955 | 6/1996 | Kaneko | 395/431 |
| 5,748,561 | 5/1998 | Hotta | 365/238.5 |
| 5,757,704 | 5/1998 | Hachiya | 365/189.07 |
| 6,031,410 | 2/2000 | Kanno | 327/407 |

OTHER PUBLICATIONS

Cheryl L. Stout Et Al., "10 Gb/s Silicon Bipolar 8:1 Multiplexer and 1:8 Demultiplexer", IEEE Journal of Solid State Circuits, vol, 28, No. 3, Mar. 1993, pp. 339–343.

*Primary Examiner*—Son Mai
*Attorney, Agent, or Firm*—Banner & Witcoff, Ltd.

[57] ABSTRACT

Two data items are simultaneously read from memory cells and are fetched into a bus exchanger. The bus exchanger selects the connection between the memory cells and a first output register and the connection between the memory cells and a second output register, in accordance with prescribed rules. The two data items are output to the first and second output registers, respectively. The first output register comprises a master latch. The second output register comprises a master latch and a slave latch. A multiplexer outputs, as output signals, the data items stored in the first and second output registers. The transistors constituting the second output register have smaller sizes (channel widths) than the transistors constituting the first output register. Since the first output register comprises one master latch only, it is possible to reduce the gate capacitance of the loads driven by the clock signal for controlling both output registers.

23 Claims, 5 Drawing Sheets

SEMICONDUCTOR MEMORY DEVICE OF DOUBLE-DATA RATE MODE

BACKGROUND OF THE INVENTION

The present invention relates to a semiconductor memory device of double-data rate (DDR) mode, and more particularly an output control circuit for use in semiconductor memory devices of double-date rate mode.

In synchronous semiconductor memory devices hitherto developed, the timing of outputting data is controlled by the clock signal . The output control circuit of each semiconductor memory device therefore has an output register.

FIG. 1 shows a conventional output register R10, and FIG. 2 is a timing chart explaining the operation of the output register. As shown in FIG. 1 the output register R10 comprises a master latch M10 and a slave latch S10. The master latch M10 is composed of clocked inverters C11 and C12 and an inverter I11. Clock signals CKM and $\overline{CKM}$ (i.e., signal obtained by inverting the signal CKM) are input t o the clocked inverters C11 and C12, respectively. The slave latch S10 is composed of clocked inverters C13 and C14 and an inverter I12. Clock signals CKS and $\overline{CKS}$ (i.e., signal obtained by inverting the signal CKS) are in put to the clocked inverters C13 and C14, respectively.

How the output register R10 operates will be described. The master latch M10 and the slave latch S10 can assume two operating states each. The first is through state, in which the input data is transferred to the output. The second is latch state, in which the input data is held, or latched. A clock signal CKM is supplied to the master latch M10 to control the state thereof. Similarly, a clock signal CKS is supplied to the slave latch S10 to control the state thereof. The clock signals CKM and CKS are input in opposite phases. Hence, the master latch M10 and the slave latch S10 assumes opposite states. That is, the latches M10 and S10 assume the latch state and the through state, respectively, or other way around.

The operation of the output register R10 will be explained in greater detail. When the clock signal s CKM and CKS are at "H" level and "L" level, respectively, the master latch M10 is in the latch state, whereas the slave latch S10 is in the through state. The states of the master latch M10 and slave latch S10 change to the through state and the latch state, respectively, when the clock signal CKS is set at "H" level, changing the state of the slave latch S10 to the latch state at time tB (FIG. 2), and the lock signal CKM is set at "L" level, changing the state of the master latch M10 to the through state at time tC (FIG. 2). As seen from FIG. 2, the time tC (FIG. 2) is slightly behind the time tB.

Thus, at time tB, the slave latch S10 starts holding input data D1 the master latch M10 latched and started holding at time tA, the start of the cycle of the clock signal CKM. The master latch M10 transfers the input data D1 at time tC, and latches data D2 at time tA'. The output of the slave latch S10, which is the output of the output register R10, is the data that was input to the output register R10 at the beginning of each cycle of the clock signal CKM.

The data output from the output register R10 is transferred to an external output circuit in most cases. In order to minimize the delay of signals, the output register R10 is provided near an output pad.

In a multi-bit semiconductor memory device, output registers are arranged in the device chip, greatly spaced from one another, each together with one output pad. Clock signals are supplied from the clock signal generating circuit to the output registers, each for controlling one output register. Since the output registers are greatly spaced, the clock signal line is very long and has high parasitic resistance. Not only the capacitance of the load that should be driven by the lock signal, but also the capacitance of the clock signal line increases inevitably. Namely, the RC delay of the clock signal is increases. This impairs the performance of the multi-bit semiconductor memory device. To make matters worse, the RC delay of the clock signal in each output register differs from that in any other output register, depending on the position of the output register. Consequently, the output registers vary in their output data, giving rise to problem called "clock skew".

Generally, in order to reduce the RC delay, a global clock signal is input to a local clock buffer. To prevent clock skew, the clock signal line is arranged so that the RC delay of the clock signal may have the same value in every output register. Whatever measures are taken to reduce the RC delay and prevent clock skew, it would be important to minimize the capacitance of the load that should be driven by the clock signal.

An output control circuit of DDR mode that incorporates output registers of the type shown in FIG. 1 will be described with reference to FIG. 3.

In synchronous semiconductor memory devices of single-data rate (SDR) mode, data is latched at each leading edge of the clock signal, or at the start of the cycle of the clock signal for controlling the output data. In synchronous semiconductor memory devices of DDR mode, data is latched not only at each leading edge of the clock signal, but also at each trailing edge thereof, i.e., the middle of the cycle of the clock signal.

In a semiconductor memory device of DDR mode, only one address data is usually input. The data designated by the address data and the data generated in the memory device will be output from the memory device. In the DDR-mode memory device, twice as much data is transferred within a unit time as in an SDR-mode memory device. It takes almost the same time to read data from a memory cell in the DDR-mode memory device as in the SDR-mode memory device. Thus, in the DDR-mode memory device, the memory cell designated by the input address and the memory cell designated by the address generated in burst mode are selected at the same time. Hence, the data items stored in these cells are detected simultaneously.

In the output control circuit of DDR mode, shown in FIG. 3, such two data items are supplied through two data lines DL1 and DL2 to the output registers R11 and R12. Subsequently, the data items are held in the output registers R11 and R12, respectively.

As shown in FIG. 3, the output registers R11 and R12 are connected at output to a multiplexer 40. As can be understood from FIG. 4, the multiplexer 40 outputs the data held in the first output register R11 to an external output circuit 42 during the first half of the cycle of the clock signal, and outputs the data held in the second output register R12 to the external output circuit 42 during the second half of the cycle of the clock signal. The data thus held in the external output circuit 42 is output when it is required.

The relation between the address of the data output from the register R11 during the first half of the cycle and the address of the data output from the register R12 during the second half of the cycle depends upon whether the burst mode is a linear one or an interleaved one. If the burst mode is an interleaved one, the relation between the addresses is altered or switched in accordance with a start address.

Therefore, each of two data items simultaneously read from two memory cells must be stored into either the output register R11 or the output register R12, in accordance with the relation between the addresses. To this end, a bus exchanger 44 is connected to the inputs of the output registers R11 and R12. The bus exchanger 44 controls the connection of the data buses which are provided between the memory cells, on the one hand, and the output registers R11 and R12, on the other. More precisely, the bus exchanger 44 connects one cell to the output register R11 or the output register R12, in accordance with preset conditions. The bus exchanger 44 may be of the type disclosed in Japanese Patent Application No. 9-295431.

In a DDR-mode semiconductor memory device, the output registers are connected in parallel as is shown in FIG. 3. Thus, the DDR-mode memory device needs to have twice as many output registers as the SDR-mode memory device. Hence, the gate capacitance of the load that should be driven by a clock signal (CKM or CKS shown in FIG. 3) for controlling one output register is twice as much. The problems inherent in the SDR-mode memory device, i.e., clock skew and low performance resulting from RC delay of the clock signal, are more acute in the DDR-mode memory device. As a consequence, data cannot be reliably read from the DDR-mode memory device at twice as high a frequency as from the SDRmode memory device.

BRIEF SUMMARY OF THE INVENTION

The object of the invention is to provide a semiconductor memory device in which the RC delay of clock signals and clock skew can be reduced, and which can therefore reliably read data at a transfer rate twice as high as a SDR-mode semiconductor memory device.

To accomplish the object, a semiconductor memory device according to the first aspect of the invention comprises: memory cells for storing data; first data storage circuit having a latch circuit; second data storage circuit having a register circuit; data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and multiplexer circuit for first outputting the data item stored in the first data storage circuit and then outputting the data item stored in the second data storage circuit.

In the semiconductor memory device, the gate capacitance of the loads driven by the clock signal for controlling the operation timing of the first and second data storage circuit can be decreased. This prevents the RC delay of the clock signal and the clock skew from increasing. As a result, the memory device can reliably read data at twice as high a data transfer rate as in a semiconductor memory device of single-data rate (SDR) mode.

A semiconductor memory device according to the second aspect of the present invention comprises: memory cells for storing data; first data storage circuit having a first register circuit; second data storage circuit having a second register circuit which has a smaller current-drive power than the first register circuit; data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and multiplexer circuit for first outputting the data item stored in the first data storage circuit and then outputting the data item stored in the second data storage circuit.

In this semiconductor memory device, too, the gate capacitance of the loads driven by the clock signal for controlling the operation timing of the first and second data storage circuit can be decreased. This prevents the RC delay of the clock signal and the clock skew from increasing. As a result, the memory device can reliably read data at twice as high a data transfer rate as in a semiconductor memory device of single-data rate (SDR) mode.

A semiconductor memory device according to the third aspect of this invention comprises: memory cells for storing data; first data storage circuit having a master latch circuit only; second data storage circuit having a master latch circuit and a slave latch circuit; data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and multiplexer circuit for first outputting the data item stored in the first data storage circuit and then outputting the data item stored in the second data storage circuit.

Also in this semiconductor memory device, the gate capacitance of the loads driven by the clock signal for controlling the operation timing of the first and second data storage circuit can be decreased. This prevents the RC delay of the clock signal and the clock skew from increasing. As a result, the memory device can reliably read data at twice as high a data transfer rate as in a semiconductor memory device of single-data rate (SDR) mode.

A semiconductor memory device according to the fourth aspect of the present invention comprises: memory cells for storing data;

first data storage circuit having a latch circuit for storing a data item input at a beginning of a clock signal controlling operation timing, during a first half-cycle of the clock signal; second data storage circuit having a register circuit for storing the data item input at the beginning of the clock signal, during an entire cycle of the clock signal; data bus control circuit for first selecting and outputting one of two data items read simultaneously from the memory cells to the first data storage circuit and then selecting and outputting the other of the two data items to the second data storage circuit; and multiplexer circuit for first outputting the data item stored in the first data storage circuit during a first half-cycle of the clock signal and then outputting the data item stored in the second data storage circuit during a second half-cycle of the clock signal.

In this semiconductor memory device, too, the gate capacitance of the loads driven by the clock signal for controlling the operation timing of the first and second data storage circuit can be decreased. This prevents the RC delay of the clock signal and the clock skew from increasing. As a result, the memory device can reliably read data at twice as high a data transfer rate as in a semiconductor memory device of single-data rate (SDR) mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A semiconductor memory device according to the present invention will be described with reference to the accompanying drawings.

Figure 5:
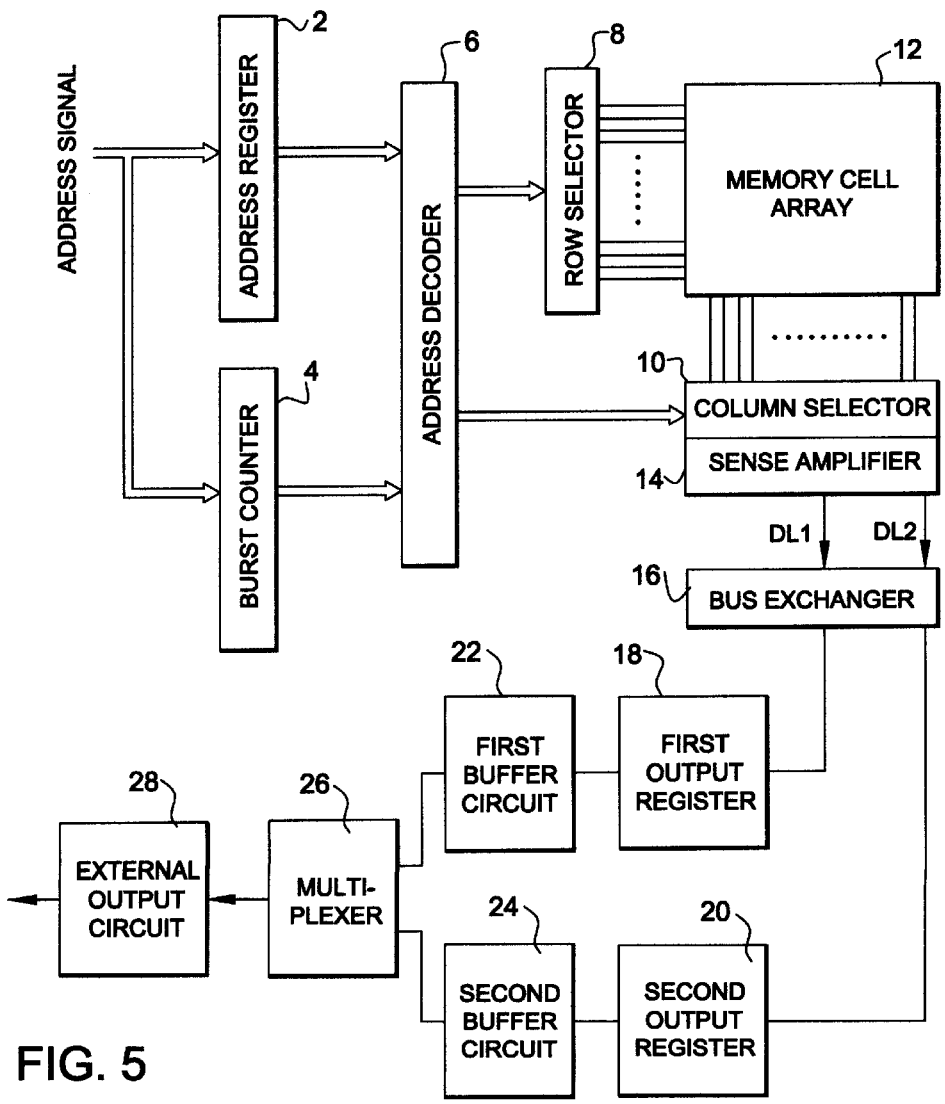
FIG. 5 is a block diagram of a semiconductor memory device according to the present invention.

FIG. 5 is a block diagram showing the semiconductor memory device. As shown in FIG. 5, the memory device comprises an address register 2, a burst counter 4, an address decoder 6, a row selector 8, a column selector 10, and a memory cell array 12. The memory device further comprises a sense amplifier 14, a bus exchanger 16, two output registers 18 and 20, two buffer circuits 22 and 24, a multiplexer 26, and an external output circuit 28.

The address register 2 temporarily stores an address input to the memory device. The burst counter 4 generates an address by itself. That is, the counter 4 generates a burst signal from the input address in accordance with prescribed rules. The address decoder 6 decodes the address signal output from the address register 2, generating a row address. It decodes the burst address signal output from the burst counter 4, too, generating a column address. The row selector 8 selects a word line in accordance with the row address it has received from the address decoder 6. The column selector 10 selects a bit line in accordance with the column address it has received from the address decoder 6.

The memory cell array 12 comprises memory cells arranged in rows and columns. The row selector 8 and the column selector 10 can select each cell. The sense amplifier 14 read data from any memory cell selected. The bus exchanger 16 receives a plurality of data items the sense amplifier 14 has read from the memory cells selected. The bus exchanger 16 determines to which output register (register 18 or register 20) the data items should be output. The first output register 18 stores the data output from the bus exchanger 16. The second output register 20 stores the data output from the bus exchanger 16, too. The first buffer circuit 22 amplifies the output of the first output register 18. The second buffer circuit 24 amplifies the output of the second output register 20. The multiplexer 26 receives the outputs of both buffer circuits 22 and 24, multiplexing the outputs into one output data item. The external output circuit 28 outputs the data that the multiplexer 26 has generated.

Figure 6:
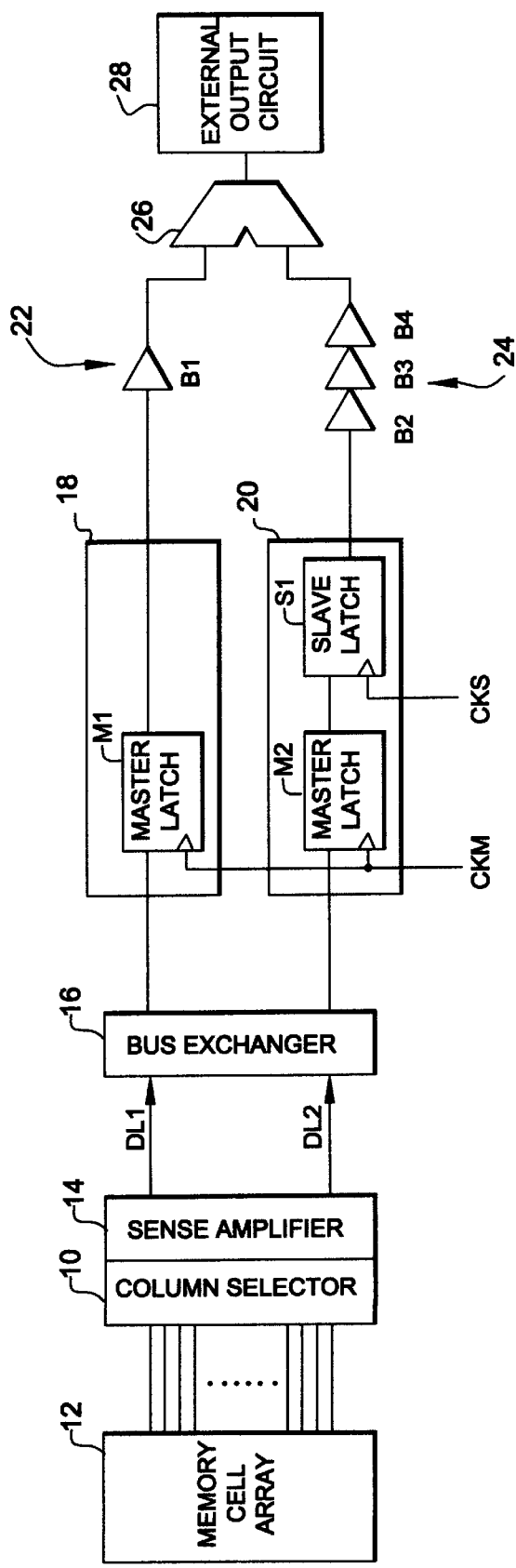
FIG. 6 is a circuit diagram of the output control circuit incorporated in the semiconductor memory device of FIG. 5.

The output control circuit provided in the semiconductor memory device of FIG. 5, between the sense amplifier 14 and the external output circuit 28, will be described in detail. FIG. 6 shows the output control circuit.

As can be seen from FIG. 6, the bus exchanger 16 switches the connection of data buses provided between the memory cells of the array 12, on the one hand, and the output registers 18 and 20, on the other hand. Altering the connection, the bus exchanger 16 selects either the first output register 18 or the second output register 20. More specifically, the bus exchanger 16 receives the first data item the sense amplifier 14 has read from one memory cell and also the second data item the sense amplifier 14 has read from another memory cell. The bus exchanger 16 outputs one of the data items (e.g., first data item) that should be output first, to the first output register 18. Then, the bus exchanger 16 outputs the other data items (i.e., second data item) to the second output register 20.

As shown in FIG. 6, the first output register 18 has a master latch Ml, which is controlled by a clock signal CKM. The second output register 20 has a master latch M2 and a slave latch S1. The master latch M2 is controlled by the clock signal CKM. The slave latch S1 is controlled by a clock signal CKS.

The master latch M2 provided in the second output register 20 comprises transistors that are smaller than the transistors of the master latch M1 used in the first output register 18. It follows that the transistors of the master latch M2 have smaller channel widths than those constituting the master latch M1. The slave latch S1 provided in the second output register 20 comprises transistors that are smaller than the transistors of the conventional slave latch shown in FIG. 3 and than those of the master latch M1 used in the first output register 18. Hence, the transistors of the salve latch S1 have smaller channel widths than the transistors constituting the conventional slave latch and the transistors constituting the master latch M1.

It is sufficient for the transistors constituting the master latch M2 and slave latch S1 to be larger than the minimum possible size at which they enable the latches M2 and S1 to function. This is because the second buffer circuit 24 is connected to the output of the second output register 20, to equalize the drive powers of the signals supplied from the output registers 18 and 20 to the multiplexer 26.

The clock signal SKM is input to the master latches M1 and M2. The master latches M1 and M2 latch data at the leading edge of the clock signal CKM. In other words, they latch the data when the signal CKM rises from "L" level to "H" level. The master latches M1 and M2 release the data at the trailing edge of the clock signal CKM. That is, they release the data when the signal CKM falls from "H" level to "L" level. The clock signal CKS is input to the slave latch S1. The slave latch S1 latches data at the leading edge of the clock signal CKS and releases the data at the trailing edge of the clock signal CKS.

As shown in FIG. 6, the first buffer circuit 22 comprises a buffer B1. The buffer B1 amplifies the output of the master latch M1 and supplies it to the multiplexer 26. The second buffer circuit 24 comprises three buffers B2, B3 and B4. Therefore, the signal output from the buffer B4 and supplied to the multiplexer 26 has the same drive power as the signal output from the buffer B1 and supplied to the multiplexer 26. The multiplexer 26 multiplexes these signals into output data. The output data is supplied to the external output circuit 28.

Figure 1:
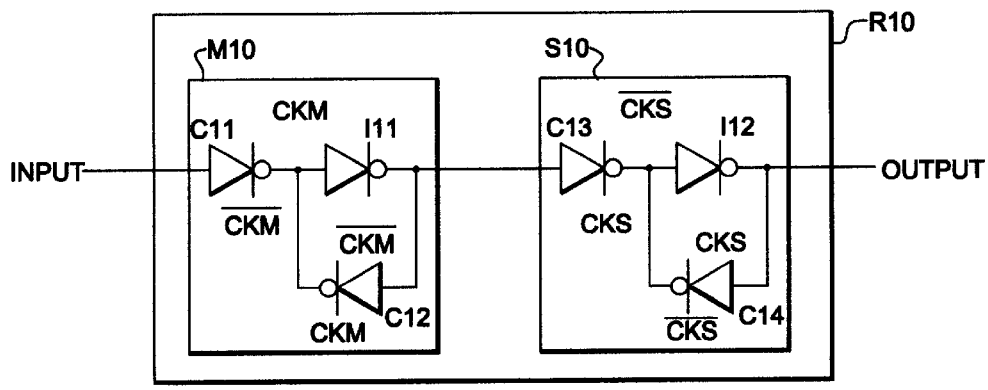
FIG. 1 is a circuit diagram of a conventional output register.
Figure 2:
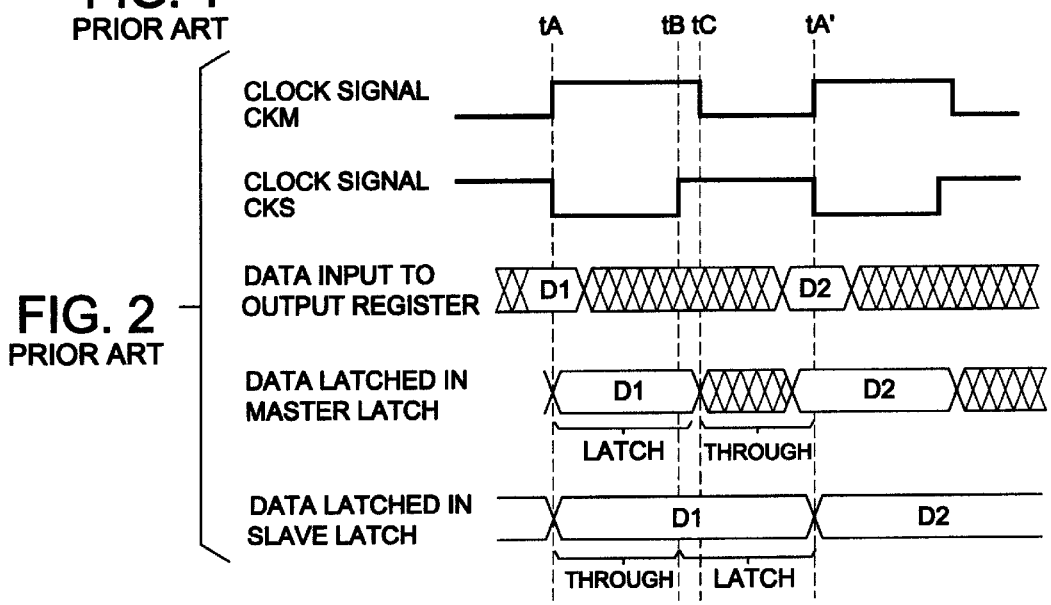
FIG. 2 is a timing chart explaining the operation of the conventional output register.
Figure 3:
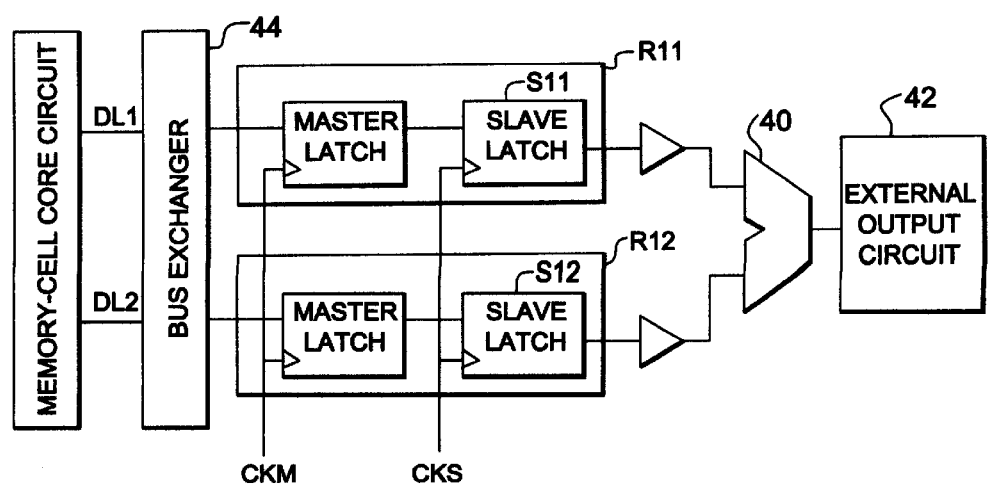
FIG. 3 is a circuit diagram of a DDR-mode output control circuit incorporating output registers of the type shown in FIG. 1.
Figure 4:
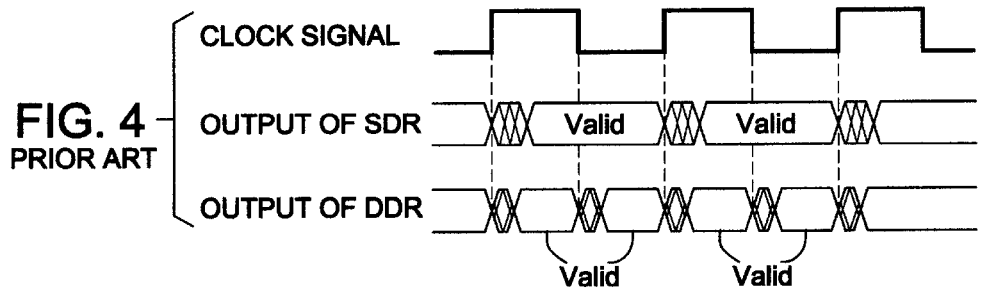
FIG. 4 is a timing chart illustrating the output of an SDR-mode semiconductor memory device and also the output of a DDR-mode semiconductor memory device.

The output control circuit shown in FIG. 6 is different from the conventional one shown in FIG. 3 in some respects. First, the first output register 18, which reads data during the first half of the cycle of the clock signal CKM, that is, at the leading edge thereof, has only a master latch M1. Second, the second output register 20, which reads data during the second half of the cycle of the clock signal CKM, that is, at the trailing edge thereof, has a master latch M2 and a slave latch S1. Third, the transistors constituting the master latch M2 and slave latch S1 of the second output register 20 have a smaller channel width than the transistors constituting the master latch M1 of the first output register 18. Fourth, three buffers B2 to B4 are connected to the output of the second output register 20 to equalize the drive powers of the signals supplied from the output registers 18 and 20 the multiplexer 26.

Figure 7A:
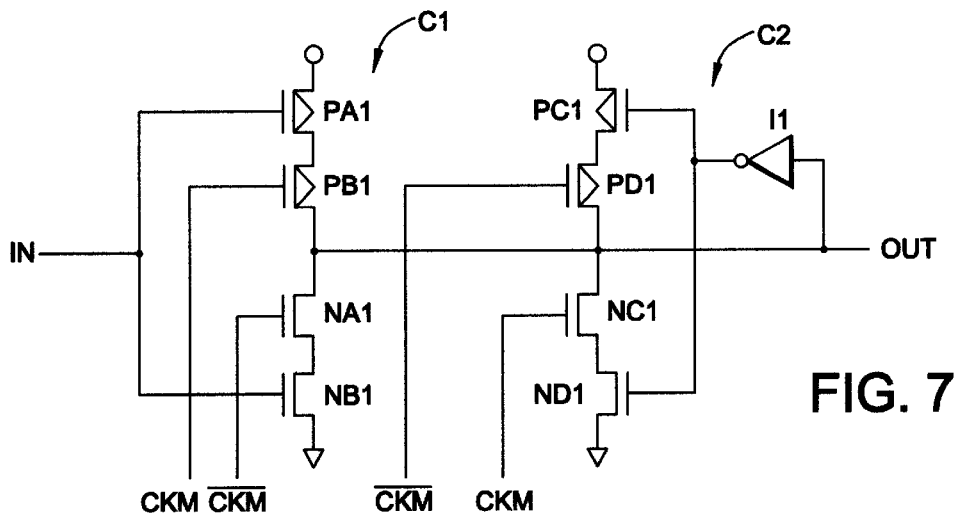
FIG. 7A is a circuit diagram of the master latch provided in the first output register of the output control circuit shown in FIG. 6.
Figure 7B:
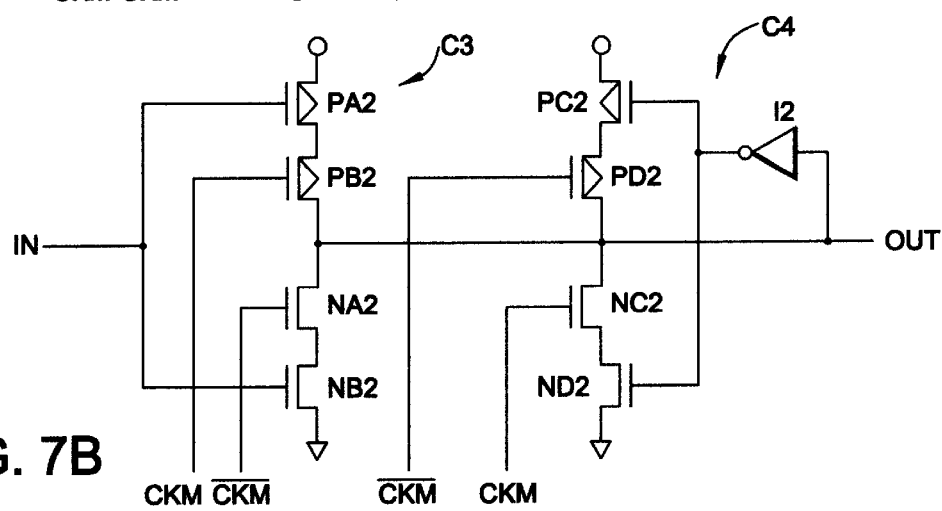
FIG. 7B is a circuit diagram of the master latch provided in the second output register of the output control circuit shown in FIG. 6.

FIG. 7A is a circuit diagram of the master latch M1. FIG. 7B is a circuit diagram of the master latch M2.

The master latch M1 has clocked inverters C1 and C2 and an inverter I1, which are connected as is shown in FIG. 7A. The clock signal CMK and a clock signal $\overline{CMK}$, obtained by inverting the signal CMK, are input to the clocked inverters C1 and C2. The clocked inverter C1 has p-channel MOS transistors PA1 and PB1 and n-channel transistors NA1 and NB1. The clocked inverter C2 has p-channel MOS transistors PC1 and PD1 and n-channel MOS transistors NC1 and ND1.

The master latch M2 has clocked inverters C3 and C4 and an inverter I2, which are connected as is shown in FIG. 7B. The clocked signals CKM and $\overline{CKH}$ are input to the clocked inverters C3 and C4. The clocked inverter C3 has p-channel MOS transistors PA2 and PB2 and n-channel MOS transistors NA2 and NB2. The clocked inverter C4 has p-channel MOS transistors PC2 and PD2 and n-channel MOS transistors NC2 and ND2.

The transistors constituting the master latch M2 are smaller in size (channel width) than the transistors constituting the master latch M1. Any two transistors that take the same position in the master latches M1 and M2, respectively, have a predetermined size ratio. Hence, the following equation holds true:

PA2/PA1=PB2/PB1=NA2/NA1=NB2/NB1=A (0<A<1)

Where PA2, PA1, PB2, PB1, NA2, NA1, NB2 and NB1 are the channel widths of the transistors designated by these symbols. The transistors of the master latch M2, other than those specified in the equation, are much smaller. They need not have such size ratios as indicated by the equation, with respect to the corresponding transistors of the master latch M1.

The operation of the semiconductor memory device shown in FIG. 5 will be explained.

As shown in FIG. 5, an address signal is input from an external device to the address register 2 and the burst counter 4. The address register 2 temporarily stores the address signal, which is output to the address decoder 6. The burst counter 4 generates a burst address signal from the address signal in accordance with the prescribed rules. The burst address signal is output to the address decoder 6.

The address decoder 6 decodes the address signal, generating a row address and a column address. The row address is output to the row selector 8, whereas the column address is output to the column selector 10. The row selector 8 selects word lines in accordance with the row address. The column selector 10 selects bit lines in accordance with the column address.

Assume that one memory cell is selected by the address signal. Also assume that another memory cell is selected by the burst address signal.

More precisely, the memory cell connected to the word line and bit line selected by the address signal is selected. The sense amplifier 14 reads the data stored in t his memory cell. The data thus read, or first data item D1, is output to the bus exchanger 16 through the data line DL1.

Meanwhile, the memory cell connected to the word line and bit line selected by the burst address signal is selected. The sense amplifier 14 reads the data stored in the memory cell selected. The data thus read, or second data item D2, is output to the bus exchanger 16 through the data line DL2.

The bus exchanger 16 outputs the first data item D1 or the second data item D2, which must be first output to an external device. In the present instance, the bus exchanger 16 outputs the first data item D1 to the first output register 18. Then, the bus exchanger 16 outputs the second data item D2 to the second output register 20. Thus, the first data item D1 to be output in the first half of the clock signal cycle is output to the first output register 18. On the other hand, the second data item D2 to be output in the second half of the clock signal cycle is output to the second output register 20.

How the first output register 18 and the second output register 20 operate will be described.

Figure 8:
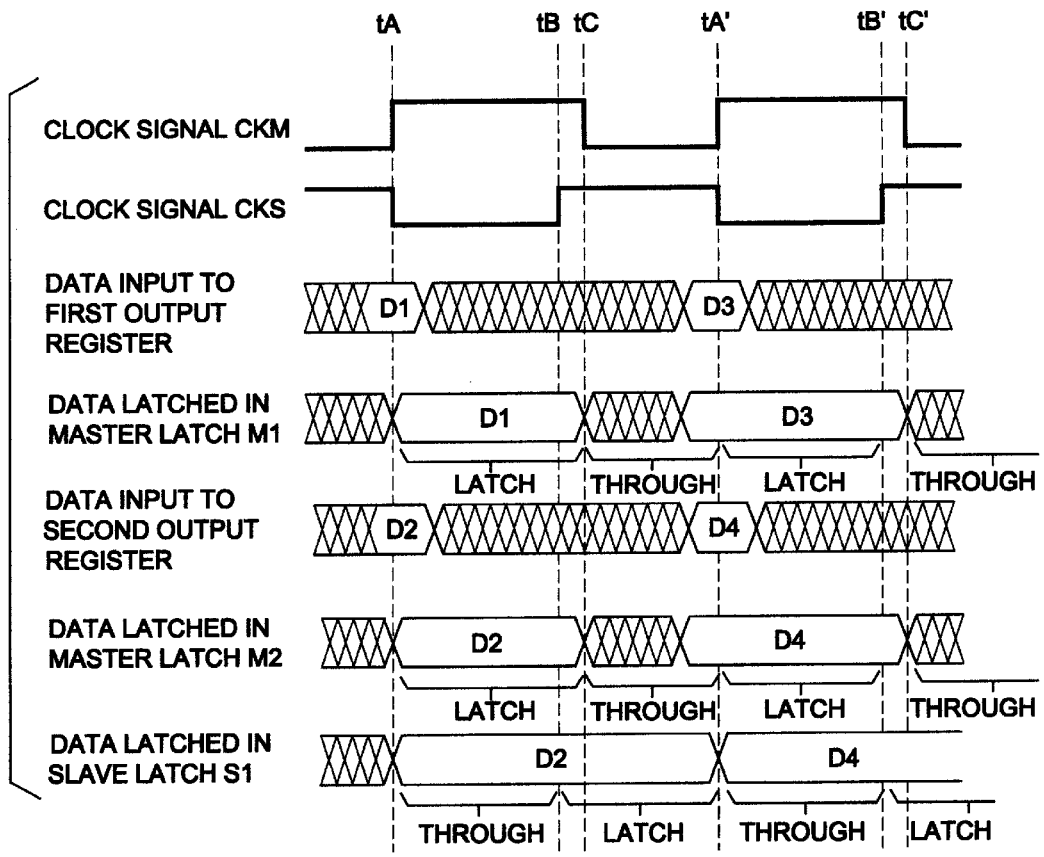
FIG. 8 is a timing chart explaining the operation of the first and second output registers of the output control circuit depicted in FIG. 6.

FIG. 8 is a timing chart explaining the operation of the first and second output registers 18 and 20. As can be understood from FIG. 8, when the first cycle-half of the clock signal CKM is input to the master latches M1 and M2 at time tA. In other words, the clock signal CKM rises from "L" level to "H" level. At this time, the master latches M1 and M2 latch the first data item D1 and the second data item D2, respectively. The first data item D1 is output from the master latch M1 to the buffer B1. The buffer B1 amplifies the first data item D1, which is supplied to the first input terminal of the multiplexer 26.

At time tA when the clock signal CKM rises from "L" level to "H" level, the clock signal CKS falls from "H" level to "L" level. The slave latch S1 therefore assumes the through state, whereby the second data item D2 is output from the master latch M2 to the buffer B2. The buffers B2, B3 and B4 amplify the second data item D2, which is input to the second input terminal of the multiplexer 26.

At time tB (FIG. 8), the clock signal CKS rises from "L" level to "H" level. The operating state of the slave latch S1 changes from the through state to the latch state. The slave latch S1 latches the second data item D2 supplied from the master latch M2. The second data item D2 is output from the slave latch S1 to the buffer B2. The buffers B2, B3 and B4 amplify the second data item D2, which is output to the second input terminal of the multiplexer 26.

At time tC (FIG. 8), the second cycle-half of the clock signal SKM is input to the master latches M1 and M2. That is, the clock signal CKM falls from "H" level to "L" level, the operating state of both master latches M1 and M2 changes from the latch state to the through state.

Assume that third and fourth data items D3 and D4 are input to the first and second output registers 18 and 20, respectively. At time tA', the first cycle-half of the clock signal CKM is again input to the master latches M1 and M2. The master latch M1 latches the third data item D3, whereas the master latch M2 latches the fourth data item D4. The third data item D3 is output from the master latch M1 to the buffer B1. The buffer B1 amplifies the third data item D3, which is output to the first input terminal of the multiplexer 26.

When the clock signal CKM rises from "L" level to "H" level, the clock signal CKS falls from "H" level to "L" level at time tA'. The slave latch S1 assumes the through state, outputting the fourth data item D4 from the master latch M2 to the buffer B2. The buffers B2, B3 and B4 amplify the fourth data item D4, which is output to the second input terminal of the multiplexer 26.

When the clock signal CKS input to the slave latch S1 rises from "L" level to "H" level at time tB' (FIG. 8), the operating state of the slave latch S1 changes from the through state to the latch state. The slave latch S1 latches the fourth data item D4 from the master latch M2. The fourth data item D4 is output from the salve latch S1 to the buffer B2. The buffers B2, B3 and B4 amplify the fourth data item D4, which is output to the second terminal of the multiplexer 26.

At time tC' (FIG. 8), the second cycle-half of the clock signal SKM is input to the master latches M1 and M2. The state of the master latches M1 and M2 changes from the latch state to the through state.

Figure 9:
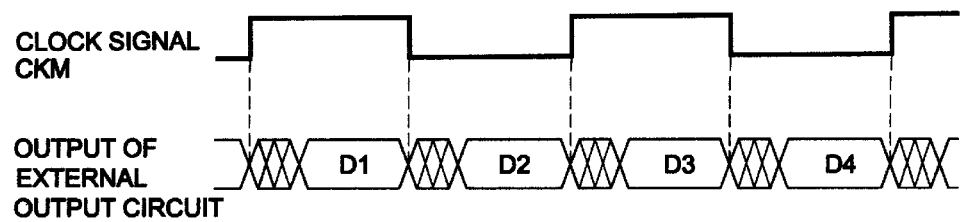
FIG. 9 is a timing chart representing the relation the output control clock signal and the output data have in the semiconductor memory device shown in FIG. 5.

The multiplexer 26 fetches the first data item D1 input to the first input terminal during the first half of the cycle of the clock signal CKM. It then fetches the second data item D2 input to the second input terminal during the second half of the cycle of the clock signal CKM. Next, it fetches the third data item D3 input to the first input terminal during the first half of the next cycle of the clock signal CKM. Further, it fetches the fourth data item D4 input to the second input terminal during the second half of the next cycle of the clock signal CKM. Thus, the multiplexer 26 converts the input data to data items which are output to the external output circuit 28, respectively in the half cycles of the clock signal CKM as is shown in FIG. 9.

As described above, the master latches M1 and M2 provided in the first and second output registers 18 and 20 hold the data items, respectively, during the first half cycle of the clock signal CKM. It is during the second half cycle of the clock signal CKM that the slave latch S1 provided in the second output register 20 holds the data.

It should be noted that the semiconductor memory device of the present embodiment, which is shown in FIG. 5, is a DDR-mode one. As in any DDR-mode memory device, data is read from the first output register 18 only during the first half cycle of the clock signal CKM. During the second half cycle of the signal CKM, data is read from the second output register 20. Hence, it is unnecessary for the first output register 18 to hold data during the second half cycle of the clock signal CKM. The first output register 18 need not have slave latches to operate well. This is why the first output register 18 has no slave latches.

Having no slave latches, the first output register 18 need not receive a clock signal for controlling the operation timing of a slave latch. The gate capacitance of the loads that should be driven by the clock signal CKS for controlling the slave latches does not increase, though the DDR-mode memory device shown in FIG. 5 has twice as many output registers as an SDR-mode semiconductor memory device.

The transistors of the first and second output registers 18 and 20 must have drive such powers that data may be transferred as fast as possible through the data buses. The drive powers are determined on the basis of the fan-out between the gate circuits for the data buses. To impart such drive powers to the transistors constituting the output registers 18 and 20, the butter B1 is connected to the output of the register 18 and the buffers B2, B3 and B3 are connected in series to the output of the register 20 as shown in FIG. 6. Thus, the data can be transferred at high speed in the first output register 18 the moment the master latch M2 and slave latch S1 assume the latch state and the through state, respectively, in the first half of the cycle of the clock signal CKM.

In the second output register 20, data is input in the first half of the cycle of the clock signal CKM and is transferred to the input terminal of the multiplexer 26, in the same way as in the first output register 18. However, the data is not fetched into the multiplexer 26 until the multiplexer 26 is switched to the second output register 20 at the trailing edge of the clock signal CKM in the second half of the cycle of the clock signal CKM. About half-cycle time is therefore available until the data is fetched from the second output register 20 into the multiplexer 26, unlike in the first output register 18. As is shown in FIG. 6, more buffers are connected between the second output register 20 and the multiplexer 26 than between the first output register 18 and the multiplexer 26. Nonetheless, no problems arise so long as the resultant data transfer delay is less than or equal to the half-cycle time.

In the second output register 20, data must be transferred at the same speed as in the first output register 18 after the multiplexer 26 is switched to the second output register 20 so that the data may be fetched into the second output register 20. To this end, the drive power of the buffer B4 is made equal to that of the buffer B1 connected to the output of the first output register 18. It is therefore unnecessary to determine drive powers for the transistors of the second output register 20 on the basis of fan-out in the external output circuit 28. The transistors constituting the second output register 20 can therefore be smaller than those of the first output register 18. Hence, it is possible greatly reduce the increase in the gate capacitance of the load which is driven by the clock signal for controlling the master latches, though the present embodiment is a DDR-mode semiconductor memory device.

The first output register 18 n e ed no t have slave latches at all. In addition, the transistors constituting the slave latch of the second output register 20 can be small. The gate capacitance of the loads driven by the clock signal for controlling the slave latches can therefore be smaller than in an SDR-move semiconductor memory device.

Figure 10:
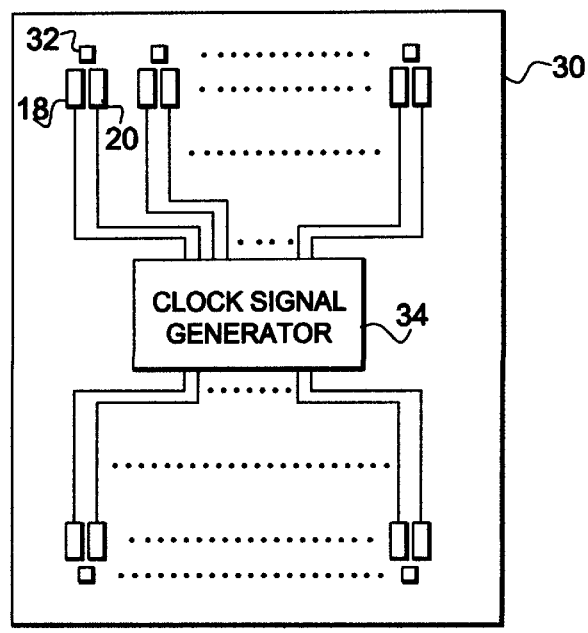
FIG. 10 is a plan view depicting the layout of the first and second output registers and clock signal generator in the semiconductor memory device (chip) of FIG. 5.

In the semiconductor memory device according to this embodiment, the first output register 18, the second output register 20, and a clock signal generator 34 are laid out on the same chip 30, in such a specific pattern as is illustrated in FIG. 10.

As shown in FIG. 10, a plurality of output pads 32 are arranged on two opposing edge parts of the chip 30. Two output registers 18 and 20 are arranged on the chip 30, near each output pad 32. The clock signal generator 34 is mounted on the center part of the chip 30. The clock signal generator 43 generates clock signals CKM and CKS for controlling the first output register 18 and the second output register 20.

As mentioned above, the clock signal generator 34 is located at the center of the chip 30 while the output registers 18 and 20 are located at the opposing edge parts of the chip 30. Therefore, the wires, each connecting the clock signal generator 34 to one pair of output registers 18 and 20, have almost the same length. In other words, the clock signals supplied to the output registers 18 and 20 delay by almost the same time. This serves to minimize the clock skew in every output register.

The capacitance of any load driven by the clock signal for controlling each output register can be reduced in the DDR-mode semiconductor memory device according to the present invention. Thus, the RC delay of the clock signals or the clock skew can be prevented from increasing, though twice as many output registers are required as in a SDR-mode semiconductor memory device. From the DDR-mode memory device of the invention, data can be read from at twice as high a frequency as is possible with the SDR-mode semiconductor memory device. In other words, the DDR-mode memory device of the invention has a data transfer rate that is actually as twice as high as that of the SDR-mode semiconductor memory device.

As has been described above, the present invention can provide a DDR-mode semiconductor memory device in which the gate capacitance of loads driven by clock signals for controlling output registers are reduced, thereby decreasing the RC delay of the clock signals and the clock skew, and which can therefore read data at a data transfer rate twice as high as a SDR-mode semiconductor memory device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

memory cells for storing data;

a first data storage circuit having a master latch circuit only;

a second data storage circuit having a master latch circuit and a slave latch circuit, the second data storage circuit having a smaller current-drive power than the first data storage circuit;

a data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and a multiplexer circuit for first outputting the data item stored in the first data storage circuit and then outputting the data item stored in the second data storage circuit.

2. A semiconductor memory device according to claim 1, further comprising:

a first amplifier circuit provided between the first data storage circuit and the multiplexer circuit; and a second amplifier circuit provided between the second data storage circuit and the multiplexer circuit;

wherein last-stage circuit elements of said first and second amplifier circuits have the same current-drive power.

3. A semiconductor memory device according to claim 2, wherein said second amplifier circuit has a plurality of buffers connected in series.

4. A semiconductor memory device according to claim 1, wherein the multiplexer circuit outputs the data item stored in the first data storage circuit, during a first half-cycle of a clock signal controlling data-reading timing, and outputs the data item stored in the second data storage circuit, during a second half-cycle of the clock signal.

5. A semiconductor memory device according to claim 1, further comprising:

an address register for receiving and temporarily storing a first address signal supplied from an external device to select the memory cells;

a burst counter for receiving the first address signal from the external device and generating a second address signal from the first address signal in accordance with prescribed rules; and a sense amplifier for reading two data items respectively from two of the memory cells which have been designated by the first and second address signals, respectively, and for outputting the two data items to the data bus control circuit.

6. A semiconductor memory device according to claim 1, further comprising:

output terminals arranged at peripheral parts of the device, for outputting signals output from the multiplexer circuit; and a clock signal generating circuit arranged at a center part of the device, for generating clock signals for controlling operation timing of the first and second data storage circuit, wherein the first data storage circuit and the second data storage circuit are arranged near the output terminals.

7. A semiconductor memory device comprising:

memory cells for storing data;

a first data storage circuit having a first register circuit;

a second data storage circuit having a second register circuit which has a smaller current-drive power than the first register circuit;

a data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and a multiplexer circuit for first outputting the data item stored in the first data storage circuit and then outputting the data item stored in the second data storage circuit.

8. A semiconductor memory device according to claim 7, further comprising:

a first amplifier circuit provided between the first data storage circuit and the multiplexer circuit; and a second amplifier circuit provided between the second data storage circuit and the multiplexer circuit;

wherein last-stage circuit elements of said first and second amplifier circuits have the same current-drive power.

9. A semiconductor memory device according to claim 8, wherein the second amplifier circuit has a plurality of buffers connected in series.

10. A semiconductor memory device according to claim 7, wherein the multiplexer circuit outputs the data item stored in the first data storage circuit, during a first half-cycle of a clock signal controlling data-reading timing, and outputs the data item stored in the second data storage circuit, during a second half-cycle of the clock signal.

11. A semiconductor memory device according to claim 7, further comprising:

an address register for receiving and temporarily storing a first address signal supplied from an external device to select the memory cells;

a burst counter for receiving the first address signal from the external device and generating a second address signal from the first address signal in accordance with prescribed rules; and a sense amplifier for reading two data items respectively from two of the memory cells which have been designated by the first and second address signals, respectively, and for outputting the two data items to the data bus control circuit.

12. A semiconductor memory device according to claim 7, further comprising:

output terminals arranged at peripheral parts of the device, for outputting signals output from the multiplexer circuit; and a clock signal generating circuit arranged at a center part of the device, for generating clock signals for controlling operation timing of the first and second data storage circuit, wherein the first data storage circuit and the second data storage circuit are arranged near the output terminals.

13. A semiconductor memory device comprising:

memory cells for storing data;

a first data storage circuit having a master latch circuit only;

a second data storage circuit having a master latch circuit and a slave latch circuit;

a data bus control circuit for selecting connection between the memory cells and the first data storage circuit and connection between the memory cells and the second data storage circuit, in accordance with prescribed rules, thereby to first output one of two data items read simultaneously from the memory cells to the first data storage circuit and to then output the other of the two data items to the second data storage circuit; and a multiplexer circuit for first outputting the data item stored in the first data storage circuit and then outputting the data item stored in the second data storage circuit.

14. A semiconductor memory device according to claim 13, further comprising:

a first amplifier circuit provided between the first data storage circuit and the multiplexer circuit; and a second amplifier circuit provided between the second data storage circuit and the multiplexer circuit;

wherein last-stage circuit elements of said first and second amplifier circuits have the same current-drive power.

15. A semiconductor memory device according to claim 14, wherein the second amplifier circuit has a plurality of buffers connected in series.

16. A semiconductor memory device according to claim 13, wherein the multiplexer circuit outputs the data item stored in the first data storage circuit, during a first half-cycle of a clock signal controlling data-reading timing, and outputs the data item stored in the second data storage circuit, during a second half-cycle of the clock signal.

17. A semiconductor memory device according to claim 13, further comprising:

an address register for receiving and temporarily storing a first address signal supplied from an external device to select the memory cells;

a burst counter for receiving the first address signal from the external device and generating a second address signal from the first address signal in accordance with prescribed rules; and a sense amplifier for reading two data items respectively from two of the memory cells which have been designated by the first and second address signals, respectively, and for outputting the two data items to the data bus control circuit.

18. A semiconductor memory device according to claim 13, further comprising:

output terminals arranged at peripheral parts of the device, for outputting signals output from the multiplexer circuit; and a clock signal generating circuit arranged at a center part of the device, for generating clock signals for controlling operation timing of the first and second data storage circuit, wherein the first data storage circuit and the second data storage circuit are arranged near the output terminals.

19. A semiconductor memory device comprising:

memory cells for storing data;

a first data storage circuit having a latch circuit for storing a data item input at a beginning of a clock signal controlling operation timing, during a first half-cycle of the clock signal;

a second data storage circuit having a register circuit for storing the data item input at the beginning of the clock signal, during an entire cycle of the clock signal;

a data bus control circuit for first selecting and outputting one of two data items read simultaneously from the memory cells to the first data storage circuit and then selecting and outputting the other of the two data items to the second data storage circuit; and a multiplexer circuit for first outputting the data item stored in the first data storage circuit during a first half-cycle of the clock signal and then outputting the data item stored in the second data storage circuit during a second half-cycle of the clock signal.

20. A semiconductor memory device according to claim 19, further comprising:

a first amplifier circuit provided between the first data storage circuit and the multiplexer circuit; and a second amplifier circuit provided between the second data storage circuit and the multiplexer circuit;

wherein last-stage circuit elements of said first and second amplifier circuits have the same current-drive power.

21. A semiconductor memory device according to claim 20, wherein the second amplifier circuit has a plurality of buffers connected in series.

22. A semiconductor memory device according to claim 19, further comprising:

an address register for receiving and temporarily storing a first address signal supplied from an external device to select the memory cells;

a burst counter for receiving the first address signal from the external device and generating a second address signal from the first address signal in accordance with prescribed rules; and a sense amplifier for reading two data items respectively from two of the memory cells which have been designated by the first and second address signals, respectively, and for outputting the two data items to the data bus control circuit.

23. A semiconductor memory device according to claim 19, further comprising:

output terminals arranged at peripheral parts of the device, for outputting signals output from the multiplexer circuit; and a clock signal generating circuit arranged at a center part of the device, for generating clock signals for controlling operation timing of the first and second data storage circuit, wherein the first data storage circuit and the second data storage circuit are arranged near the output terminals.

* * * * *